US009805959B2

(12) United States Patent
Matsumoto

(10) Patent No.: US 9,805,959 B2
(45) Date of Patent: Oct. 31, 2017

(54) PLASMA PROCESSING APPARATUS AND PLASMA PROCESSING METHOD

(71) Applicant: TOKYO ELECTRON LIMITED, Tokyo (JP)

(72) Inventor: Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 313 days.

(21) Appl. No.: 14/394,112

(22) PCT Filed: May 17, 2013

(86) PCT No.: PCT/JP2013/063833
§ 371 (c)(1),
(2) Date: Oct. 13, 2014

(87) PCT Pub. No.: WO2013/172456
PCT Pub. Date: Nov. 21, 2013

(65) Prior Publication Data
US 2015/0087162 A1 Mar. 26, 2015

(30) Foreign Application Priority Data
May 18, 2012 (JP) .................................. 2012-114934

(51) Int. Cl.
C23C 16/00 (2006.01)
C23F 1/00 (2006.01)
(Continued)

(52) U.S. Cl.
CPC ...... H01L 21/67069 (2013.01); C23C 16/405 (2013.01); C23C 16/511 (2013.01);
(Continued)

(58) Field of Classification Search
USPC .............................. 118/723 MW; 156/345.41
See application file for complete search history.

(56) References Cited

U.S. PATENT DOCUMENTS

2002/0123200 A1* 9/2002 Yamamoto ......... H01J 37/32211
438/345
2003/0019842 A1* 1/2003 Hineman .......... H01J 37/32623
216/72
(Continued)

FOREIGN PATENT DOCUMENTS

TW      201137966 A1   11/2011
WO   2010/001938 A1    1/2010

OTHER PUBLICATIONS

International Search Report dated Jul. 23, 2013 in PCT/JP2013/063833.

Primary Examiner — Rakesh Dhingra
(74) Attorney, Agent, or Firm — Rothwell, Figg, Ernst & Manbeck, P.C.

(57) ABSTRACT

A plasma processing apparatus includes: a processing container which defines a processing space; a microwave generator; a dielectric having an opposing surface which faces the processing space; a slot plate formed with a plurality of slots; and a heating member provided within the slot plate. The slot plate is provided on a surface of the dielectric at an opposite side to the opposing surface to radiate microwaves for plasma excitation to the processing space through the dielectric based on the microwaves generated by the microwave generator.

5 Claims, 8 Drawing Sheets

(51) Int. Cl.
*H01L 21/306* (2006.01)
*H01L 21/67* (2006.01)
*C23C 16/511* (2006.01)
*H05H 1/46* (2006.01)
*C23C 16/40* (2006.01)
*H01J 37/32* (2006.01)
*H01L 21/263* (2006.01)
*H01L 21/3065* (2006.01)
*H01L 21/324* (2006.01)

(52) U.S. Cl.
CPC .... *H01J 37/3222* (2013.01); *H01J 37/32192* (2013.01); *H01L 21/2636* (2013.01); *H01L 21/3065* (2013.01); *H01L 21/324* (2013.01); *H05H 1/46* (2013.01); *H05H 2001/463* (2013.01)

(56) References Cited

U.S. PATENT DOCUMENTS

| | | | | |
|---|---|---|---|---|
| 2004/0061449 A1* | 4/2004 | Arai | .................. | H01J 37/32724 315/111.21 |
| 2007/0113978 A1* | 5/2007 | Ishii | .................. | H01J 37/32192 156/345.42 |
| 2007/0163502 A1* | 7/2007 | Nozawa | .............. | C23C 16/4411 118/723 R |
| 2009/0194236 A1* | 8/2009 | Ono | .................. | H01J 37/32192 156/345.41 |

* cited by examiner

PLASMA PROCESSING APPARATUS AND PLASMA PROCESSING METHOD

CROSS REFERENCE TO RELATED APPLICATION

This application is a 35 U.S.C. 371 National Phase Application from PCT/JP/2013/063833, filed May 17, 2013, which claims priority to Japanese Patent Application No. 2012-114934, filed May 18, 2012, the disclosures of which are incorporated herein in their entirety by reference.

TECHNICAL FIELD

Various aspects and exemplary embodiments of the present disclosure relate to a plasma processing apparatus and a plasma processing method.

BACKGROUND ART

In a semiconductor manufacturing process, a plasma processing is widely performed for the purpose of, for example, etching or deposition of a thin film. In order to obtain a semiconductor which has a high performance and high function, it is requested that the plasma processing be uniformly performed on an entire processing target surface of a substrate to be processed.

In a recent plasma processing, a plasma processing apparatus using excitation of a process gas by microwaves has been used. The plasma processing apparatus irradiates microwaves generated by a microwave generator as microwaves for plasma excitation by using a slot plate having a plurality of slots formed therein. The plasma processing apparatus guides the microwaves for plasma excitation, which are irradiated from the slot plate, to a processing space by a dielectric provided between the slot plate and the plasma processing space.

However, in the plasma processing apparatus, it is requested that the uniformity in dielectric temperature be maintained in order to uniformly perform the plasma processing on the entire processing target surface of the substrate to be processed. In this respect, Patent Document 1 discloses a plasma processing apparatus in which a heating mechanism is provided in an outer periphery of a side wall of a chamber so that a dielectric is heated from a peripheral portion thereof by the heating mechanism.

PRIOR ART DOCUMENT

Patent Document

Patent Document 1: International Publication No. WO2010-001938

DISCLOSURE OF THE INVENTION

Problems to be Solved

However, in the conventional technology, heat cannot be uniformly transferred to the entire surface of the dielectric even if the peripheral portion of the dielectric is heated. Thus, the temperature uniformity of the dielectric may be impaired.

Means to Solve the Problems

A plasma processing apparatus according to an aspect of the present disclosure includes a processing container which defines a processing space; a microwave generator; a dielectric having an opposing surface which faces the processing space. Also, the plasma processing apparatus includes a slot plate formed with a plurality of slots and provided on a surface of the dielectric at an opposite side to the opposing surface to radiate microwaves for plasma excitation to the processing space through the dielectric based on the microwaves generated by the microwave generator. Also, the plasma processing apparatus includes a heating member provided within the slot plate.

Effect of the Invention

According to various aspects and exemplary embodiments of the present disclosure, a plasma processing apparatus and a plasma processing method which can maintain a temperature uniformity of a dielectric may be achieved.

DETAILED DESCRIPTION TO EXECUTE THE INVENTION

Figure 1:
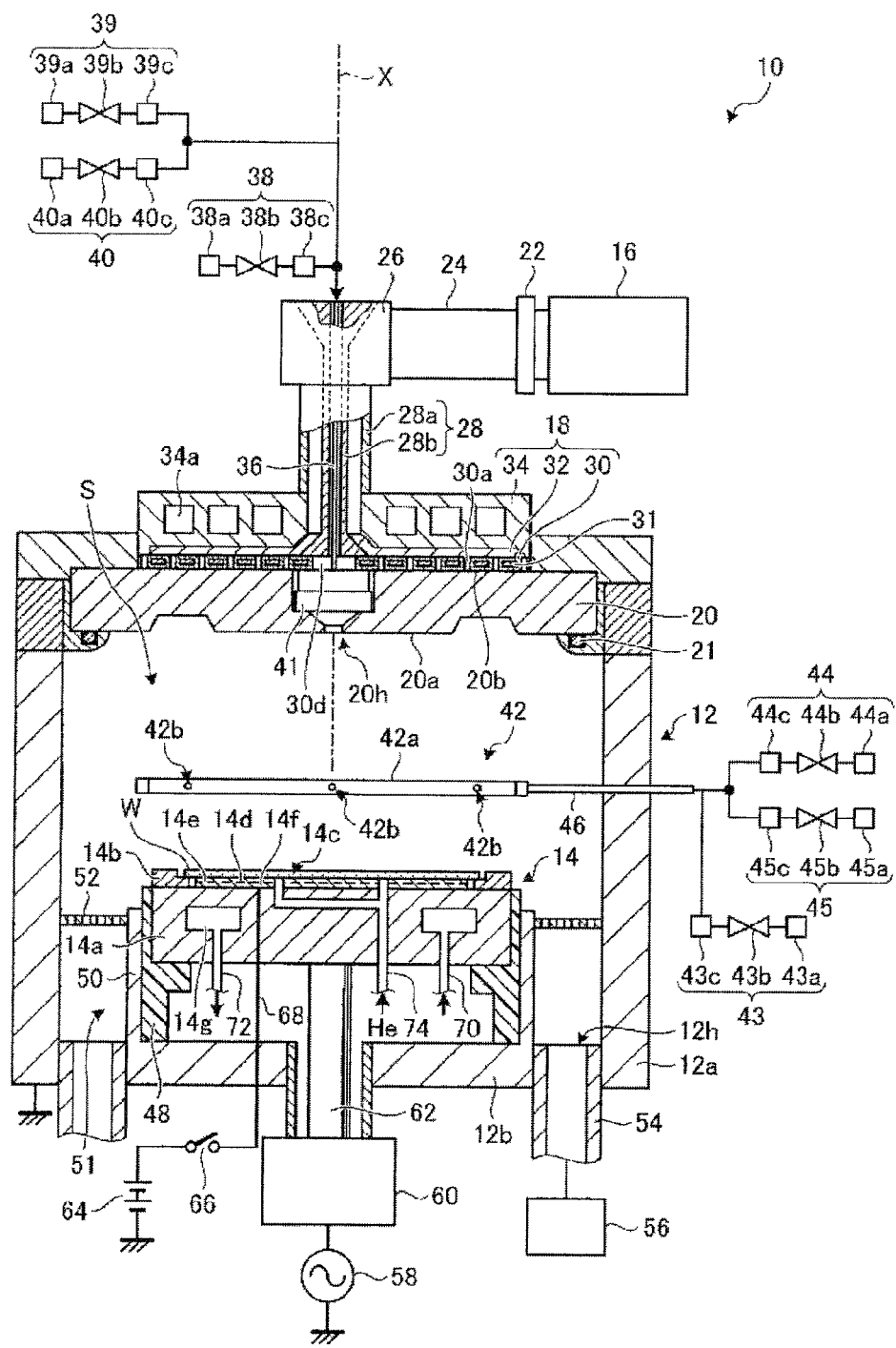
FIG. 1 is a view schematically illustrating a plasma processing apparatus according to an exemplary embodiment.

Hereinafter, exemplary embodiments will be described in detail with reference to drawings. In each drawing, the same or equivalent portions will be denoted by the same reference numerals.

FIG. 1 is a view schematically illustrating a plasma processing apparatus according to an exemplary embodiment. A plasma processing apparatus 10 illustrated in FIG. 1 includes a processing container 12, a stage 14, a microwave generator 16, an antenna 18, and a dielectric window 20.

The processing container 12 defines a processing space S for performing a plasma processing. The processing container 12 includes a side wall 12a, and a bottom portion 12b. The side wall 12a is formed in a substantially tubular shape. Hereinafter, an X axis along which the tubular shape extends is virtually set at the center of the tubular shape of the side wall 12a, and the extension direction of the X axis is referred to as an X axis direction. The bottom portion 12b is provided at the bottom side of the side wall 12a, and covers the bottom side opening of the side wall 12a. An exhaust port 12h for exhaust is provided in the bottom portion 12b. The top portion of the side wall 12a is opened.

The top side opening of the side wall 12a is closed by the dielectric window 20. An O ring 21 is interposed between the dielectric window 20 and the top portion of the side wall 12a. The dielectric window 20 is provided on the top portion of the side wall 12a through the O ring 21. The processing container 12 may be more securely sealed by the O ring 21. The stage 14 is accommodated within the processing space S, on which a substrate to be processed W (hereinafter, referred to as a substrate W) is placed. The dielectric window 20 includes an opposing surface 20a which faces the processing space S.

The microwave generator 16 generates microwaves of, for example, 2.45 GHz. In an exemplary embodiment, the plasma processing apparatus 10 further includes a tuner 22, a waveguide 24, a mode converter 26, and a coaxial waveguide 28.

The microwave generator 16 is connected to the waveguide 24 through the tuner 22. The waveguide 24 is, for example, a rectangular waveguide. The waveguide 24 is connected to the mode converter 26, and the mode converter 26 is connected to the upper end of the coaxial waveguide 28.

The coaxial waveguide 28 extends along the X axis. The coaxial waveguide 28 includes an outer conductor 28a and an inner conductor 28b. The outer conductor 28a is formed in a substantially cylindrical shape which extends in the X axis direction. The inner conductor 28b is provided within the outer conductor 28a. The inner conductor 28b is formed in a substantially cylindrical shape which extends in the X axis direction.

Microwaves generated by the microwave generator 16 are guided to the mode converter 26 through the tuner 22 and the waveguide 24. The mode converter 26 converts a mode of microwaves, and supplies the mode-converted microwaves to the coaxial waveguide 28. The microwaves are supplied from the coaxial waveguide 28 to the antenna 18.

The antenna 18 irradiates microwaves for plasma excitation based on the microwaves generated by the microwave generator 16. The antenna 18 includes a slot plate 30, a dielectric plate 32, and a cooling jacket 34. The antenna 18 is provided on a surface 20b at the opposite side to the opposing surface 20a of the dielectric window 20, and irradiates microwaves for plasma excitation to the processing space S through the dielectric window 20 based on the microwaves generated by the microwave generator 16.

Figure 2:
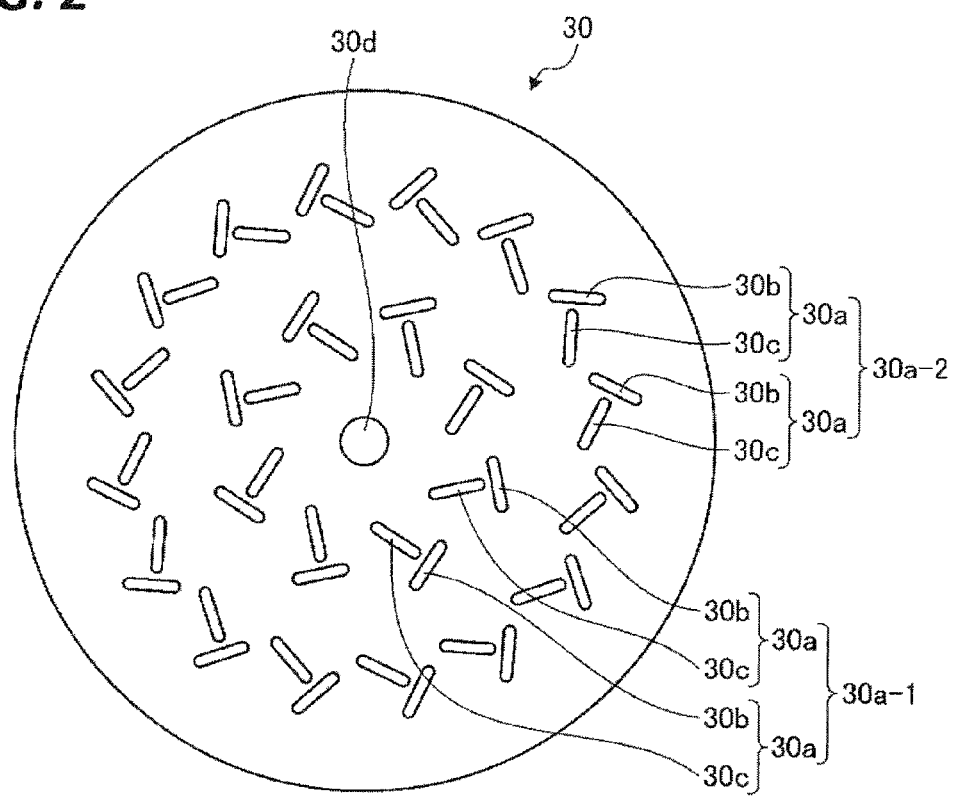
FIG. 2 is a plan view of a slot plate according to an exemplary embodiment when viewed from an X axis direction.

The slot plate 30 is formed substantially in a disk shape in which a plate surface is perpendicular to the X axis. The slot plate 30 is disposed on the surface 20b at the opposite side to the opposing surface 20a of the dielectric window 20 so that its plate surface is fitted to the plate surface of the dielectric window 20. In the slot plate 30, a plurality of slots 30a is arranged around the X axis in the circumferential direction. FIG. 2 is a plan view of the slot plate according to an exemplary embodiment when viewed from an X axis direction. In an exemplary embodiment, as illustrated in FIG. 2, the slot plate 30 constitutes a radial line slot antenna. The slot plate 30 is made of a conductive metal and is formed in a disk shape. In the slot plate 30, a plurality of slots 30a is formed. The slots 30a include slots 30b and slots 30c which are elongated holes extending in crossing or orthogonal directions. The plurality of slots 30a is arranged at predetermined intervals in the radial direction, and is also arranged at predetermined intervals in the circumferential direction.

That is, the plurality of slots 30a includes a plurality of first slot groups 30a-1 formed to be arranged along the circumferential direction of the slot plate 30, and a plurality of second slot groups 30a-2 formed to be arranged along the circumferential direction of the slot plate 30 outside the first slot groups 30a-1 in the radial direction of the slot plate 30. A through hole 30d is formed at the center portion of the slot plate 30 and a conduit 36 to be described later may pass through the through hole 30d.

Figure 3:
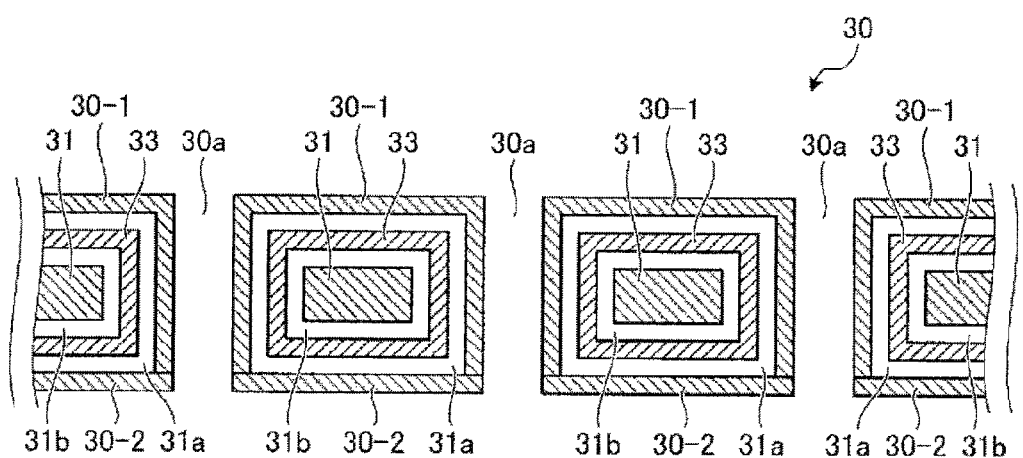
FIG. 3 is a vertical cross-sectional view schematically illustrating a slot plate according to an exemplary embodiment.
Figure 4:
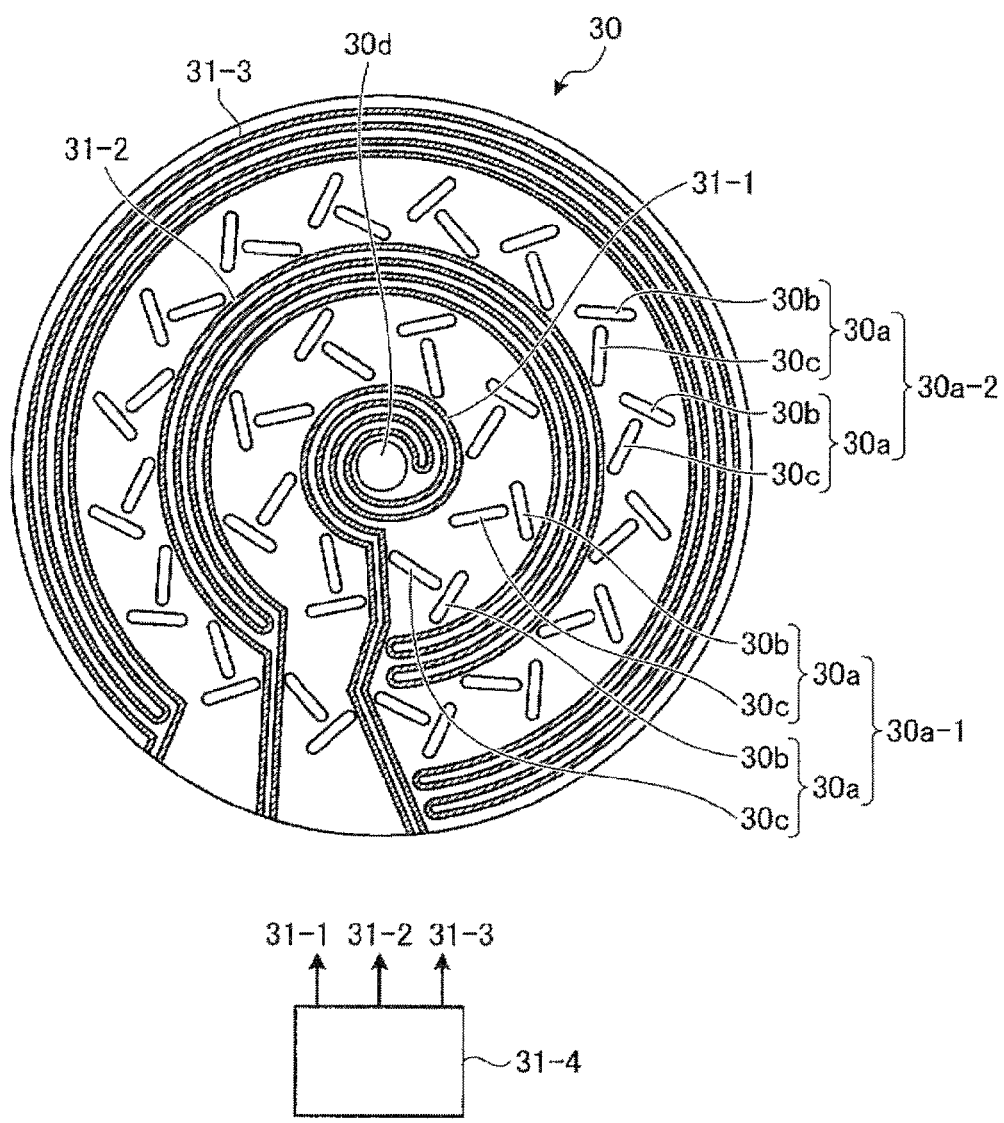
FIG. 4 is a horizontal cross-sectional view of a slot plate according to an exemplary embodiment.

FIG. 1 is referred to again. As illustrated in FIG. 1, a plurality of heaters 31 is provided within the slot plate 30. Here, descriptions will be made on a detailed configuration of the slot plate 30 and the heaters 31. FIG. 3 is a vertical cross-sectional view schematically illustrating the slot plate according to an exemplary embodiment. FIG. 4 is a horizontal cross-sectional view of the slot plate according to the exemplary embodiment.

As illustrated in FIG. 3, the slot plate 30 includes an upper slot plate 30-1 formed in a rectangular box shape with an opened bottom side, and a lower slot plate 30-2 which closes the opening at the bottom side of the upper slot plate 30-1.

A rubber sheet 33 made of an insulating material is formed in a tubular shape and is accommodated within a space 31a formed by the upper slot plate 30-1 and the lower slot plate 30-2. A heater 31 is accommodated in a tubular space 31b of the rubber sheet 33. That is, the heater 31 is covered with the rubber sheet 33, and is insulated with respect to the upper slot plate 30-1 and the lower slot plate 30-2 by the rubber sheet 33. The heater 31 is a heating member containing, for example, titanium, in which current flows to generate heat by Joule heat.

As illustrated in FIG. 4, the heaters 31 include a center heater 31-1 spirally arranged in a central region of the slot plate 30, a middle heater 31-2 spirally arranged in an intermediate region between the central region and an outer periphery region of the slot plate 30, and an edge heater 31-3 spirally arranged in the outer periphery region of the slot plate 30. In the center heater 31-1, the middle heater 31-2, and the edge heater 31-3, a current supplied from a power supply 31-4 flows to generate heat by Joule heat.

The center heater 31-1 is drawn from the outer periphery of the slot plate 30 to the central region of the slot plate 30 while avoiding the slots 30a, is arranged spirally at the central region of the slot plate 30, and then is drawn to the outer periphery of the slot plate 30 while avoiding the slots 30a. The middle heater 31-2 is drawn from the outer periphery of the slot plate 30 to the intermediate region between the central region and the outer periphery region of the slot plate 30 while avoiding the slots 30a, is arranged spirally at the intermediate region of the slot plate 30, and then is drawn to the outer periphery of the slot plate 30 while avoiding the slots 30a. The edge heater 31-3 is drawn from the outer periphery of the slot plate 30 to the outer periphery region of the slot plate 30, is arranged spirally at the outer periphery region of the slot plate 30, and then is drawn to the outer periphery of the slot plate 30.

When the center heater 31-1, the middle heater 31-2 and the edge heater 31-3 are provided within the slot plate 30 as in the present exemplary embodiment, the center heater 31-1, the middle heater 31-2 and the edge heater 31-3 may heat the dielectric window 20 over a wide range at a position nearest to the dielectric window 20. As a result, according to the present exemplary embodiment, since the temperature uniformity of the dielectric window 20 may be maintained, a plasma processing may be uniformly performed on the entire processing target surface of a substrate W.

FIG. 1 is referred to again. The dielectric plate 32 is formed substantially in a disk shape in which a plate surface is perpendicular to the X axis. The dielectric plate 32 is provided between the slot plate 30 and the bottom surface of the cooling jacket 34. The dielectric plate 32 is made of, for example, quartz, and is formed substantially in a disk shape. The surface of the cooling jacket 34 is conductive. The cooling jacket 34 has a flow path 34*a* in which a coolant may be circulated, and cools the dielectric plate 32 and the slot plate 30 by circulation of the coolant. The top surface of the cooling jacket 34 is electrically connected to the lower end of the outer conductor 28*a*. The lower end of the inner conductor 28*b* is electrically connected to the slot plate 30 through the hole formed at the central portion of the cooling jacket 34 and the dielectric plate 32.

Microwaves are propagated from the coaxial waveguide 28 to the dielectric plate 32 and introduced into the processing space S from the slots 30*a* of the slot plate 30 through the dielectric window 20. The dielectric window 20 is formed substantially in a disk shape, and is made of, for example, quartz. The dielectric window 20 is provided between the processing space S and the antenna 18, and is provided just below the antenna 18 in the X axis direction in an exemplary embodiment.

In an exemplary embodiment, the conduit 36 passes through an inner hole of the inner conductor 28*b* of the coaxial waveguide 28. The through hole 30*d* is formed at the center portion of the slot plate 30 and the conduit 36 may pass through the through hole 36*d*. The conduit 36 extends along the X axis, and is connected to a gas supply system 38, a gas supply system 39, and a gas supply system 40.

The gas supply system 38 supplies a processing gas for processing a substrate W to the conduit 36. The processing gas supplied by the gas supply system 38 includes carbon. The processing gas, in an exemplary embodiment, an etching gas, and is, for example, $CF_4$ gas, or $CH_2F_2$ gas. The gas supply system 38 may include a gas source 38*a*, a valve 38*b*, and a flow rate controller 38*c*. The gas source 38*a* is a gas source of the processing gas. The valve 38*b* switches between supplying and stop of supplying of the processing gas from the gas source 38*a*. The flow rate controller 38*c* is, for example, a mass flow controller, and is configured to adjust the flow rate of the processing gas supplied from the gas source 38*a*.

The gas supply system 39 supplies oxygen gas ($O_2$ gas) to the conduit 36. The oxygen gas supplied from the gas supply system 39 constitutes a cleaning gas. The gas supply system 39 may include a gas source 39*a*, a valve 39*b*, and a flow rate controller 39*c*. The gas source 39*a* is a gas source of the oxygen gas. The valve 39*b* switches between supplying and stop of supplying of the gas from the gas source 39*a*. The flow rate controller 39*c* is, for example, a mass flow controller, and is configured to adjust the flow rate of the gas supplied from the gas source 39*a*.

The gas supply system 40 supplies argon gas to the conduit 36. In an exemplary embodiment, in addition to the cleaning gas supplied form the gas supply system 39, the argon gas is supplied from the gas supply system 40. The gas supply system 40 may include a gas source 40*a*, a valve 40*b*, and a flow rate controller 40*c*. The gas source 40*a* is a gas source of the argon gas. The valve 40*b* switches between supplying and stop of supplying of the argon gas from the gas source 40*a*. The flow rate controller 40*c* is, for example, a mass flow controller, and is configured to adjust the flow rate of the argon gas supplied from the gas source 40*a*.

In an exemplary embodiment, the plasma processing apparatus 10 may further include an injector 41. The injector 41 supplies a gas from the conduit 36 to a through hole 20*h* formed in the dielectric window 20. The gas supplied to the through hole 20*h* of the dielectric window 20 is supplied to the processing space S. In the following description, a gas supply route constituted by the conduit 36, the injector 41, and the through hole 20*h* may be referred to as a "central gas introducing section."

In an exemplary embodiment, the plasma processing apparatus 10 may further include a gas supply unit 42. The gas supply unit 42 supplies a gas to the processing space S at a location around the X axis between the stage 14 and the dielectric window 20. In the following description, the gas supply unit 42 may be referred to as a "peripheral gas introducing section." The gas supply unit 42 includes a conduit 42*a*. The conduit 42*a* extends annularly around the X axis between the dielectric window 20 and the stage 14. In the conduit 42*a*, a plurality of gas supply holes 42*b* is formed. The plurality of gas supply holes 42*b* is arranged annularly and opened toward the X axis to supply the gas supplied to the conduit 42*a* toward the X axis. The gas supply unit 42 is connected to a gas supply system 43, a gas supply system 44, and a gas supply system 45 through a conduit 46.

The gas supply system 43 supplies a processing gas for processing a substrate W to the gas supply unit 42. The processing gas supplied form the gas supply system 43 includes carbon like the processing gas of the gas supply system 38. The processing gas is, in an exemplary embodiment, an etching gas, and is, for example, $CF_4$ gas, or $CH_2F_2$ gas. The gas supply system 43 may include a gas source 43*a*, a valve 43*b*, and a flow rate controller 43*c*. The gas source 43*a* is a gas source of the processing gas. The valve 43*b* switches between supplying and stop of supplying of the processing gas from the gas source 43*a*. The flow rate controller 43*c* is, for example, a mass flow controller, and is configured to adjust the flow rate of the processing gas supplied from the gas source 43*a*.

The gas supply system 44 supplies oxygen gas ($O_2$ gas) to the gas supply unit 42. The gas supplied from the gas supply system 44 constitutes a cleaning gas. The gas supply system 44 may include a gas source 44*a*, a valve 44*b*, and a flow rate controller 44*c*. The gas source 44*a* is a gas source of the oxygen gas. The valve 44*b* switches between supplying and stop of supplying of the gas from the gas source 44*a*. The flow rate controller 44*c* is, for example, a mass flow controller, and is configured to adjust the flow rate of the gas supplied from the gas source 44*a*.

The gas supply system 45 supplies an argon gas to the gas supply unit 42. In an exemplary embodiment, in addition to the cleaning gas supplied form the gas supply system 44, the argon gas is supplied from the gas supply system 45. The gas supply system 45 may include a gas source 45*a*, a valve 45*b*, and a flow rate controller 45*c*. The gas source 45*a* is a gas source of the argon gas. The valve 45*b* switches between supplying and stop of supplying of the argon gas from the gas source 45*a*. The flow rate controller 45*c* is, for example, a mass flow controller, and is configured to adjust the flow rate of the argon gas from the gas source 45*a*.

The stage 14 is provided to face the dielectric window 20 in the X axis direction. The stage 14 is provided so that the processing space S is placed between the dielectric window 20 and the stage 14. On the stage 14, the substrate W is placed. In an exemplary embodiment, the stage 14 includes a base 14a, a focus ring 14b, and an electrostatic chuck 14c.

The base 14a is supported by a tubular support 48. The tubular support 48 is made of an insulating material, and extends vertically upwardly from the bottom portion 12b. A conductive tubular support 50 is provided at the outer periphery of the tubular support 48. The tubular support 50 extends vertically upwardly from the bottom portion 12b of the processing container 12 along the outer periphery of the tubular support 48. An annular exhaust path 51 is formed between the tubular support 50 and the side wall 12a.

An annular baffle plate 52 in which a plurality of through holes is provided is attached at the upper portion of the exhaust path 51. An exhaust device 56 is connected to the lower end of the exhaust port 12h through an exhaust tube 54. The exhaust device 56 includes a vacuum pump such as, for example, a turbo molecular pump. The processing space S within the processing container 12 may be decompressed to a required vacuum degree by the exhaust device 56.

The base 14a also serves as a high frequency electrode. The base 14a is electrically connected to a high frequency power supply 58 for RF bias through a power feeding rod 62 and a matching unit 60. The high frequency power supply 58 outputs a high frequency power of a predetermined frequency, for example, 13.65 MHz, at a predetermined power level. The predetermined frequency is suitable for controlling energy of ions to be drawn to the substrate W. The matching unit 60 accommodates a matching device configured to match the impedance at the high frequency power supply 58 side with the impedance at the load side mainly such as, for example, the electrode, the plasma, and the processing container 12, and a blocking condenser configured to generate self bias is included in the matching device.

On the top surface of the base 14a, the electrostatic chuck 14c is provided. The electrostatic chuck 14c holds the substrate W by an electrostatic attraction force. The focus ring 14b that annularly surrounds the periphery of the substrate W is provided outside the electrostatic chuck 14c in a radial direction. The electrostatic chuck 14c includes an electrode 14d, an insulating film 14e, and an insulating film 14f. The electrode 14d is formed of a conductive film, and is provided between the insulating film 14e and the insulating film 14f. A high-voltage DC power supply 64 is electrically connected to the electrode 14d through a switch 66 and a coated wire 68. The substrate W may be attracted and held on the electrostatic chuck 14c by a Coulomb force generated by DC voltage applied from the DC power supply 64.

An annular coolant chamber 14g is provided within the base 14a to extend in a circumferential direction. Coolant having a predetermined temperature, for example, cooling water is circulated and supplied to the coolant chamber 14g from a chiller unit (not illustrated) through pipes 70 and 72. The temperature of the top surface of the electrostatic chuck 14c is controlled by the temperature of the coolant. A heat-transfer gas, for example, He gas, is supplied to a portion between the top surface of the electrostatic chuck 14c and a rear surface of the substrate W through a gas supply pipe 74, and the temperature of the substrate W is controlled by the temperature of the top surface of the electrostatic chuck 14c.

Figure 5:
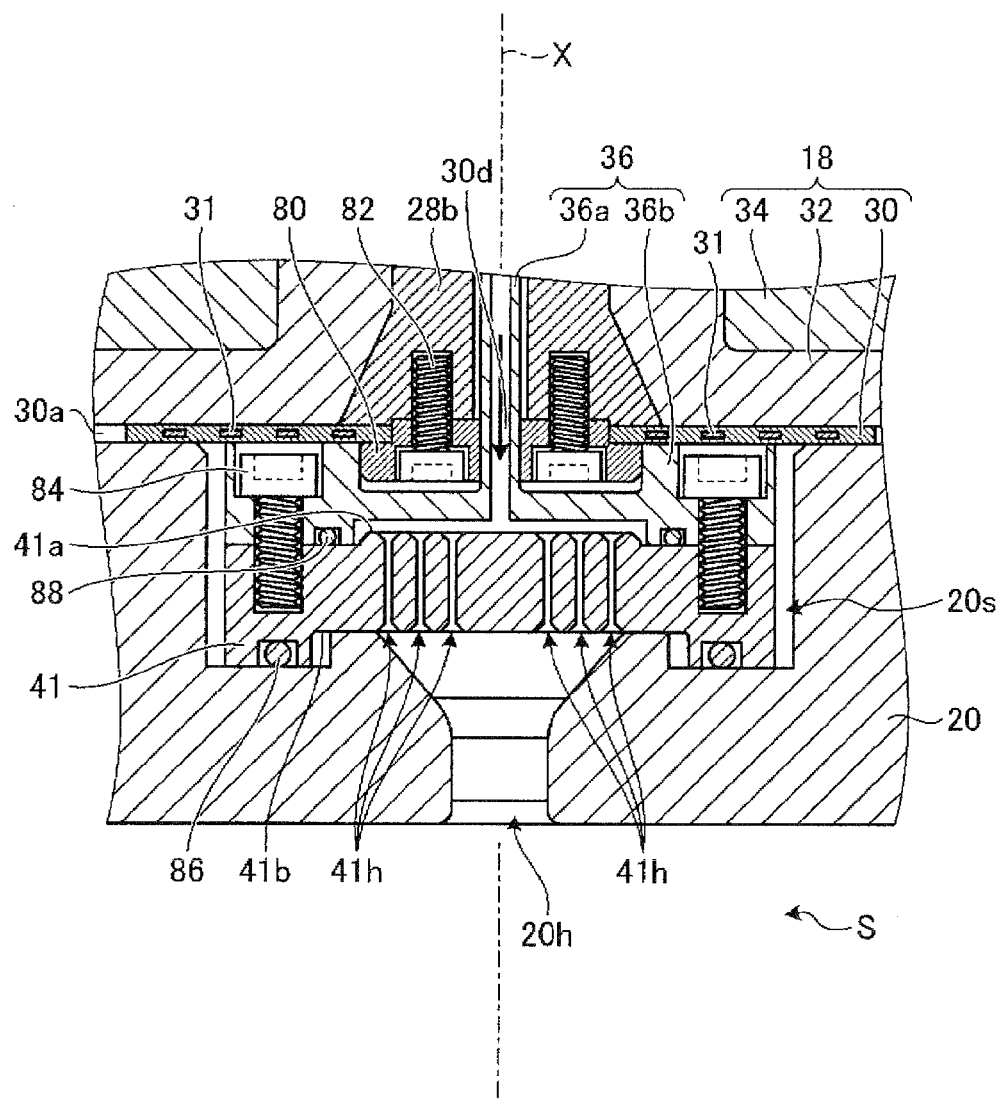
FIG. 5 is a cross-sectional view illustrating an injector and a through hole of a dielectric window according to an exemplary embodiment in an enlarged scale.

Hereinafter, referring to FIG. 5, the injector 41 and the through hole 20h of the dielectric window 20 will be described in more detail. FIG. 5 is a cross-sectional view illustrating the injector and the through hole of the dielectric window according to an exemplary embodiment in an enlarged scale.

As illustrated in FIG. 5, the dielectric window 20 defines an accommodation space 20s and the through hole 20h in this order from the top side along the X axis. The through hole 20h communicates the accommodation space 20s with the processing space S. The through hole 20h is configured such that an area of one position between an opening at the antenna 18 side and an opening at the processing space S side is smaller than an area of another position of the through hole 20h between the one position and the opening at the antenna 18 side. Here, the "area" refers to an area of the through hole 20h in a plane perpendicular to the X axis. In an example, as illustrated in FIG. 5, the through hole 20h is formed in a tapered shape which has a diameter decreasing downwards along the X axis.

The injector 41 and one end portion 36b of the conduit 36 are accommodated in the accommodation space 20s. The conduit 36 may be made of a conductive metal. The conduit 36 includes a main body portion 36a and the one end portion 36b. The main body portion 36a is formed in a tubular shape extending along the X axis. The one end portion 36b is formed substantially in a disk shape, and has a larger outer diameter than the main body portion 36a. In the conduit 36, an inner hole for gas supply is provided through the main body portion 36a and the one end portion 36b. The main body portion 36a of the conduit 36 passes through the inner hole of the inner conductor 28b.

The inner conductor 28b, as described above, is connected to the slot plate 30. In an exemplary embodiment, the through hole 30d is formed along the X axis at the center of the slot plate 30. The inner periphery of the slot plate 30 which defines the through hole 30d is clamped by the lower end of the inner conductor 28b and a metallic member 80. The member 80 is fixed to the lower end of the inner conductor 28b by screws 82. The bottom surface of the slot plate 30 is in contact with the top surface of the one end portion 36b of the conduit 36. In this manner, the inner conductor 28b, the slot plate 30, and the conduit 36 are electrically connected to each other.

The injector 41 is accommodated within the accommodation space 20s below the one end portion 36b of the conduit 36. The injector 41 is conductive and is formed substantially in a disk shape. The injector 41 is made of, for example, aluminum or stainless steel.

The injector 41 includes a first surface 41a at the one end portion 36b side and a second surface 41b at the through hole 20h side. A plurality of through holes 41h is formed in the injector 41 to extend from the first surface 41a to the second surface 41b. In an exemplary embodiment, a film of Y2O3 may be formed on the second surface 41b. This film may be formed by coating Y2O3 on the second surface 41b, and melting the coated film by electron beam.

The injector 41 is fixed to the one end portion 36b of the conduit 36 by screws 84, and is electrically connected to the one end portion 36b. Accordingly, the injector 41 may be set to have the same potential as the inner conductor 28b, the slot plate 30, and the conduit 36. The injector 41 may be set to have, for example, a ground potential.

In an exemplary embodiment, an O ring 86 is provided between the second surface 41b of the injector 41 and the dielectric window 20. The O ring 86 annularly extends to surround openings of the plurality of through holes 41h at the through hole 20h side. By the O ring 86, airtightness between the injector 41 and the dielectric window 20 is secured. An O ring 88 is provided between the first surface 41a of the injector 41 and the one end portion 36b of the conduit 36. The O ring 88 annularly extends to surround openings of the plurality of through holes 41h at the one end portion 36b side. Accordingly, airtightness between the injector 41 and the one end portion 36b of the conduit 36 is secured.

In the plasma processing apparatus 10 configured as described above, a gas is supplied into the processing space S from the through hole 20h of the dielectric window 20 along the X axis through the conduit 36 and the through holes 41h of the injector 41. Also, below the through hole 20h, a gas is supplied from the gas supply unit 42 toward the X axis. Microwaves are introduced from the antenna 18 into the processing space S and/or the through hole 20h through the dielectric window 20. Accordingly, plasma is generated in the processing space S and/or the through hole 20h. As described above, according to the plasma processing apparatus 10, plasma may be generated without applying a magnetic field.

Figure 6:
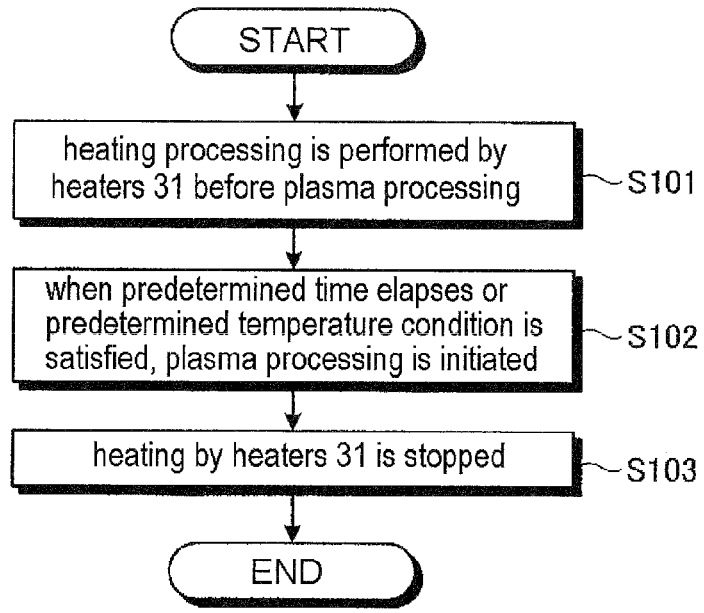
FIG. 6 is a flowchart of a plasma processing method according to an exemplary embodiment.

Hereinafter, a plasma processing method using the plasma processing apparatus 10 of FIG. 1 will be described. FIG. 6 is a flowchart of a plasma processing method according to an exemplary embodiment. As illustrated in FIG. 6, the plasma processing method according to an exemplary embodiment, first, a heating processing is performed by the heaters 31 before microwaves generated by the microwave generator 16 are irradiated to the processing space S through the antenna 18 and the dielectric window 20 (step S101).

Then, in the plasma processing method, a plasma processing is performed in which microwaves for plasma excitation are irradiated to the processing space S when the heating processing in step S101 has been performed for a predetermined time, or the component temperature of, for example, the dielectric window 20, of the plasma processing apparatus 10 reaches a predetermined temperature (step S102). Then, in the plasma processing method, when the plasma processing of step S102 is initiated, the heating processing by the heaters 31 is stopped (step S103).

In an exemplary embodiment as described above, the heating processing by the heaters 31 may be, but not exclusively, stopped when the plasma processing for irradiating the microwaves for plasma excitation to the processing space S is initiated. For example, when the heating processing in step S101 has been performed for a predetermined time, or the component temperature of, for example, the dielectric window 20, of the plasma processing apparatus 10 reaches a predetermined temperature, the heating processing by the heaters 31 may be stopped, and then the plasma processing for irradiating the microwaves for plasma excitation to the processing space S may be performed.

Figure 7:
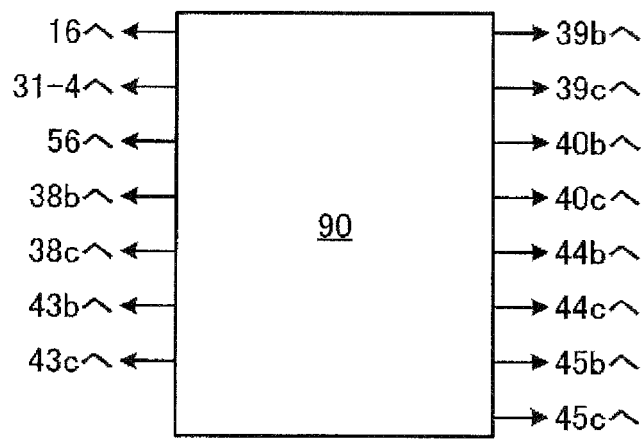
FIG. 7 is a view illustrating a control unit provided in a plasma processing apparatus according to an exemplary embodiment.

In an exemplary embodiment, the plasma processing apparatus 10 further includes a control unit configured to control various operations of the plasma processing apparatus 10, such as the plasma processing method as described above. FIG. 7 is a view illustrating the control unit provided in the plasma processing apparatus according to an exemplary embodiment. The plasma processing apparatus 10 further includes a control unit 90 illustrated in FIG. 7.

The control unit 90 may be a computer provided with a storage device such as, for example, a central processing unit (CPU) and a memory. The control unit 90 may output various control signals according to programs stored in the storage device. The various control signals output from the control unit 90 are input to the microwave generator 16, the power supply 31-4 configured to flow current in the heaters 31, the exhaust device 56, the valve 38b, the flow rate controller 38c, the valve 43b, the flow rate controller 43c, the valve 39b, the flow rate controller 39c, the valve 40b, the flow rate controller 40c, the valve 44b, the flow rate controller 44c, the valve 45b, and the flow rate controller 45c, respectively. For example, the power supply 31-4 for the heaters 31 controls the execution and stop of the heating processing by the heaters 31 based on the control signal output from the control unit 90.

Figure 8A:
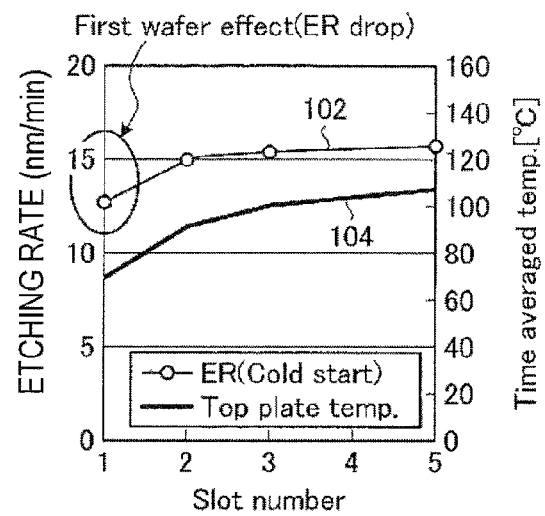
FIG. 8A is a view for explaining an effect of a plasma processing method according to an exemplary embodiment.
Figure 8B:
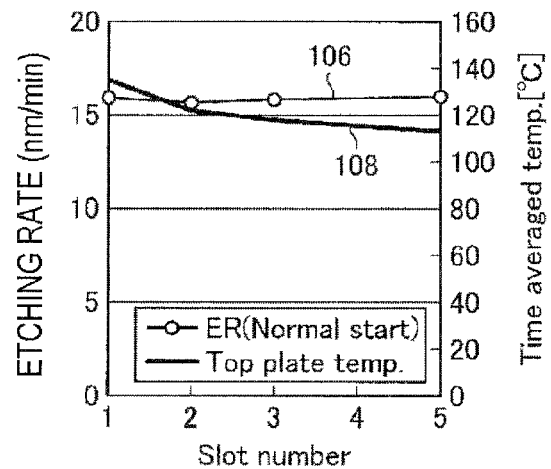
FIG. 8B is a view for explaining an effect of a plasma processing method according to an exemplary embodiment.
Figure 8C:
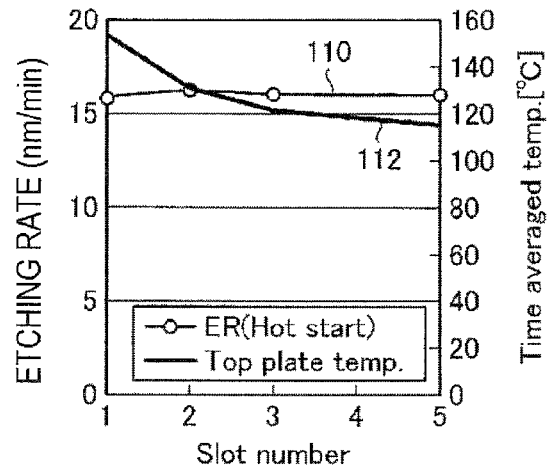
FIG. 8C is a view for explaining an effect of a plasma processing method according to an exemplary embodiment.

Hereinafter, an effect of the plasma processing method according to an exemplary embodiment will be described. FIGS. 8A to 8C are views for explaining an effect of the plasma processing method according to an exemplary embodiment. FIGS. 8A to 8C are views illustrating an effect of the plasma processing method according to an exemplary embodiment when the plasma etching processing is performed on a substrate W by the plasma processing apparatus 10.

In FIGS. 8A to 8C, the horizontal axis represents a number (a slot number) indicating a processing sequence of the substrate W loaded in the plasma processing apparatus 10 within one lot, and the vertical axis represents an etching rate (nm/min) and a time average temperature (° C.) of the dielectric window 20. FIG. 8A is a graph illustrating the relationship between the temperature of the dielectric window 20 and the etching rate when the plasma etching processing is performed on the substrate W without using the plasma processing method according to an exemplary embodiment. Meanwhile, FIGS. 8B and 8C are graphs illustrating the relationship between the temperature of the dielectric window 20 and the etching rate when the plasma etching processing is performed on the substrate W by using the plasma processing method according to an exemplary embodiment.

First, as illustrated in FIG. 8A, in a case where the plasma processing method according to an exemplary embodiment was not used, as illustrated in graph 104, when a substrate of slot number "1" was processed, the temperature of the dielectric window 20 was low as compared to a case where substrates W of other slot numbers were processed. As illustrated in graph 102, an etching rate on the substrate W of slot number "1" was low as compared to etching rates of the substrates W of other slot numbers. This is called a first wafer effect, which is a phenomenon where the etching rate of the substrate W of slot number "1" is decreased due to a low temperature of the dielectric window 20 (and the processing space S) when the substrate W of slot number "1" is processed.

In contrast, in a case where the plasma processing method according to an exemplary embodiment is used, a heating processing is performed by the heaters 31 before a plasma etching processing is performed. As a result, as illustrated in graph 108 of FIG. 8B, when the substrate W of slot number "1" was processed, the temperature of the dielectric window 20 became equal to or slightly higher than that in a case where the substrates W of other slot numbers were processed. In this manner, in the plasma processing method according to an exemplary embodiment, a high temperature of the dielectric window 20 (and the processing space S) may be maintained when the substrate W of slot number "1" is processed, and the temperature uniformity of the dielectric window 20 may be maintained. As a result, the plasma processing on the entire processing target surface of the substrate W was uniformly performed, and as illustrated in graph 106, the etching rate of the substrate W of slot number "1" was kept equal to the etching rates of the substrates W of other slot numbers.

FIG. 8C is a graph illustrating a relationship between the temperature and etching rate of the dielectric window 20 in a case where the heating processing was performed by the heaters 31 for a longer time than that of FIG. 8B. As illustrated in graph 112 of FIG. 8C, when the substrate W of slot number "1" was processed, the temperature of the dielectric window 20 was greatly increased as compared to a case where the substrates W of other slot numbers were processed. In this manner, according to the plasma processing method according to an exemplary embodiment, a high temperature of the dielectric window 20 (and the processing space S) may be maintained when the substrate W of slot number "1" is processed, and the temperature uniformity of the dielectric window 20 may be maintained. As a result, the plasma processing on the entire processing target surface of the substrate W was uniformly performed, and as illustrated in graph 110, the etching rate of the substrate W of slot number "1" was kept equal to the etching rates of the substrates W of other slot numbers.

Figure 9:
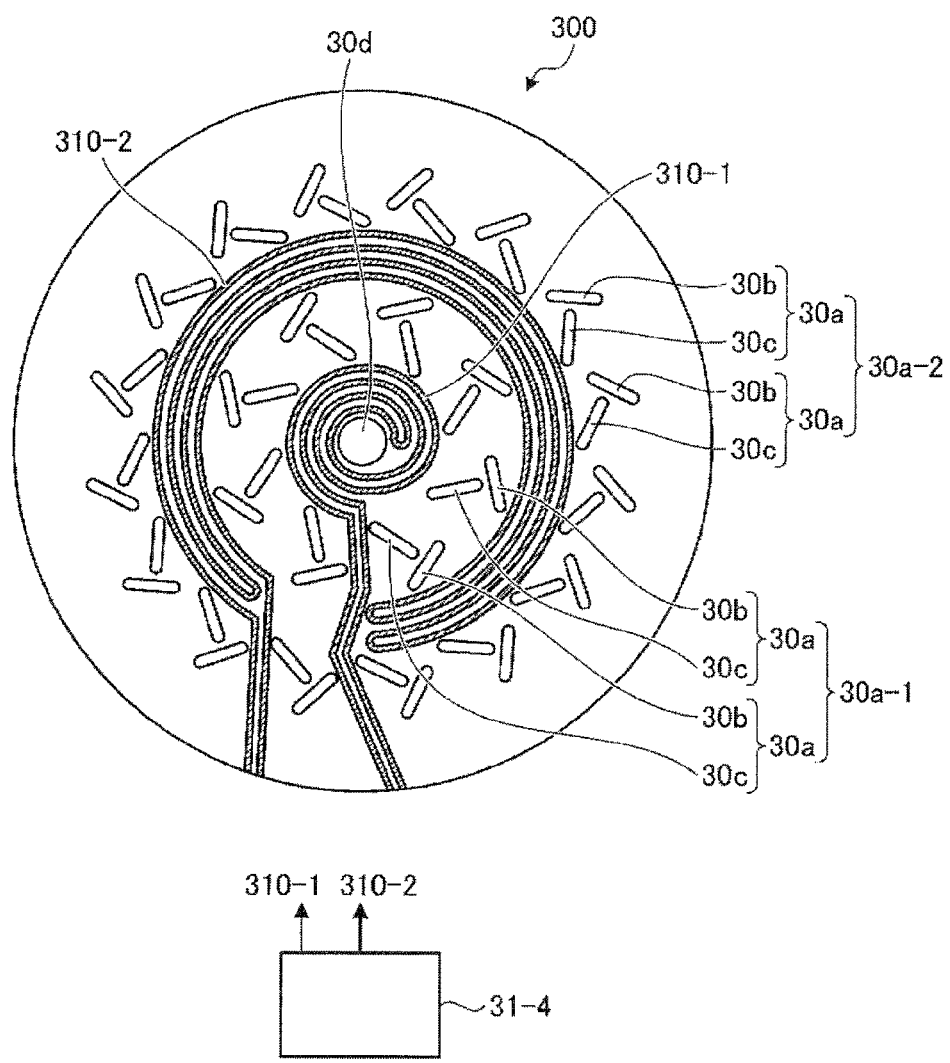
FIG. 9 is a cross-sectional plan view of a modified example of a slot plate according to an exemplary embodiment.

In the above described exemplary embodiment, as an example, the heaters 31 may be, but not exclusively, arranged over the entire surface within the slot plate 30. Hereinafter, a modified example of a slot plate will be described. FIG. 9 is a cross-sectional plan view of a modified example of the slot plate according to an exemplary embodiment.

As illustrated in FIG. 9, a slot plate 300 according to a modified example includes a center heater 310-1 spirally arranged in a central region of the slot plate 300, and a middle heater 310-2 spirally arranged in an intermediate region between the central region and an outer periphery region of the slot plate 300. In the slot plate 300 according to the modified example, no heater is provided in the outer periphery region of the slot plate 300. In this manner, in the slot plate 300 according to the modified example, heaters are not arranged over the entire surface within the slot plate 300, but the heaters 310 are arranged only in the central region and the intermediate region of the slot plate 300.

In the slot plate 300 of a modified example, since the dielectric window 20 may be heated in a wide range by the center heater 310-1 and the middle heater 310-2 at a position nearest to the dielectric window 20, the temperature uniformity of the dielectric window 20 may be maintained. It is difficult to increase the temperature of the dielectric window 20 in the central region and the intermediate region. Thus, the temperature control of the dielectric window 20 may be efficiently performed by arranging the heaters 310. As a result, a plasma processing may be uniformly performed on the entire processing target surface of a substrate W, and also as described in FIG. 8B, and FIG. 8C, the etching rate of the substrate W of slot number "1" may be kept equal to the etching rates of the substrates W of other slot numbers. Further, within the slot plate, heaters 31 may be freely arranged irrespective of heater arrangement illustrated in FIGS. 4 and 9.

Figure 10:
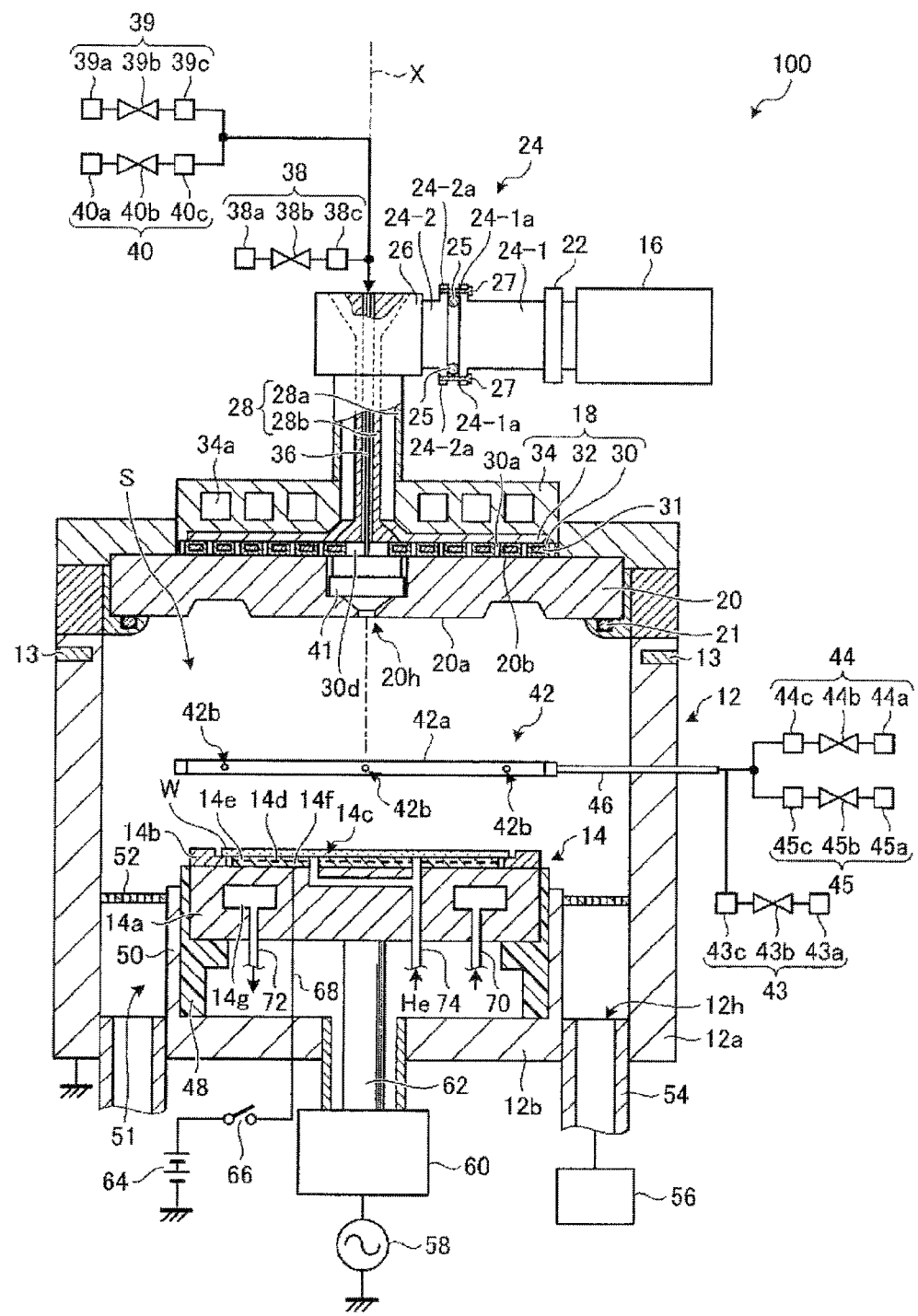
FIG. 10 is a view schematically illustrating a modified example of a plasma processing apparatus according to an exemplary embodiment.

Hereinafter, a modified example of the plasma processing apparatus according to an exemplary embodiment will be described. FIG. 10 is a view schematically illustrating a modified example of a plasma processing apparatus according to an exemplary embodiment. A plasma processing apparatus 100 according to a modified example has the same configuration as that of the plasma processing apparatus 10 illustrated in FIG. 1, but is different from the plasma processing apparatus 10 illustrated in FIG. 1 in that a heat removal member 13 is provided on the side wall 12a of the processing container 12, and a heat removal member is provided on the waveguide 24. Accordingly, descriptions on the same configuration as that of the plasma processing apparatus 10 illustrated in FIG. 1 will be omitted.

As illustrated in FIG. 10, the heat removal member 13 is provided on the side wall 12a of the processing container 12 in the plasma processing apparatus 100 of a modified example. More specifically, the heat removal member 13 is annularly embedded in a recess formed along the circumferential direction at the outer periphery side of the side wall 12a in one portion of the tubular extension direction of the side wall 12a. That is, the side wall 12a in one portion of the tubular extension direction is thinner in thickness as compared to that in other portions. The heat removal member 13 is made of a material having a low thermal conductivity, such as, for example, beryllium copper or tungsten.

Accordingly, in a portion of the tubular extension direction of the side wall 12a, heat resistance is larger than that in other portions. Accordingly, in the plasma processing apparatus 100 of a modified example, the heat applied to the dielectric window 20 by, for example, heating of the heaters 31 may be suppressed from being transferred to the processing container 12 through the side wall 12a. Thus, the heat uniformity of the dielectric window 20 may be further maintained.

Also, as illustrated in FIG. 10, in the plasma processing apparatus 100 of a modified example, an annular O ring 25 is provided as a heat removal member on the waveguide 24. More specifically, the waveguide 24 includes a first waveguide 24-1 in a tubular shape, and a second waveguide 24-2 in a tubular shape. The second waveguide 24-2 is disposed to be arranged in the tubular extension direction of the first waveguide 24-1, and has the same diameter as the first waveguide 24-1. The first waveguide 24-1 has a flange 24-1a formed to face the second waveguide 24-2. The second waveguide 24-2 has a flange 24-2a formed to face the first waveguide 24-1.

The O ring 25 is provided on a surface opposite to each of the flange 24-1a and the flange 24-2a, and the flange 24-1a and the flange 24-2a are fastened by a plurality of bolts 27 along the circumferential direction. That is, the flange 24-1a and the flange 24-2a are in close contact with each other through the O ring 25. Accordingly, microwaves generated by the microwave generator 16 are guided to the mode converter 26 through the tuner 22, the first waveguide 24-1, and the second waveguide 24-2.

The waveguide 24 has a high heat resistance at the junction between the first waveguide 24-1 and the second waveguide 24-2. Accordingly, according to the plasma processing apparatus 100 of a modified example, the heat applied to the dielectric window 20 by, for example, heating of the heaters 31 may be suppressed from being transferred to the tuner 22 and the microwave generator 16 through, for example, the inner conductor 28b, the mode converter 26, and the waveguide 24. Thus, the heat uniformity of the dielectric window 20 may be further maintained.

As described above, according to the plasma processing apparatus of the present exemplary embodiment, since the heaters 31 are provided within the slot plate 30, the dielectric window 20 may be heated at a position nearest to the dielectric window 20. As a result, according to the present exemplary embodiment, the temperature uniformity of the dielectric window 20 may be maintained, and thus a plasma processing may be uniformly performed on the entire processing target surface of a substrate W.

Also, in the plasma processing method of the present exemplary embodiment, a heating processing is performed by the heaters 31 before a plasma processing is performed on a substrate W. Then, in the plasma processing method of the present exemplary embodiment, a plasma processing is performed when the heating processing has been performed for a predetermined time, or the component temperature of, for example, the dielectric window 20, of the plasma processing apparatus reaches a predetermined temperature. Then, when the plasma processing is initiated, the heating processing by the heaters 31 is stopped. Accordingly, according to the plasma processing method of the present exemplary embodiment, the first wafer effect which is a phenomenon in which etching rates of initial substrates W such as a substrate W of a first slot are lowered when the plasma processing is initiated may be suppressed.

That is, the first wafer effect may occur due to a low temperature of, for example, the dielectric window 20 when a plasma processing is performed again after a certain time has elapsed after a previous plasma processing. In contrast, in the plasma processing method of the present exemplary embodiment, the heating processing is performed by the heaters 31 before the plasma processing is performed. Thus, when a substrate W of an initial slot is performed, the temperature of the dielectric window 20 may be equal to or slightly higher than that in a case where substrates W of other following slots are processed. Accordingly, in the plasma processing method according to the present exemplary embodiment, a high temperature of the dielectric window 20 may be maintained when the substrate W of the initial slot is processed, and the temperature uniformity of the dielectric window 20 may be maintained. As a result, the plasma processing on the entire processing target surface of the substrate W may be uniformly performed. The etching rate of the substrate W of the initial slot may be kept equal to the etching rates of the substrates W of other following slots.

DESCRIPTION OF REFERENCE NUMERALS 10, 100: plasma processing apparatus
12: processing container
13: heat removal member
14: stage
16: microwave generator
18: antenna
20: dielectric window
30: 300 slot plate
30a: slot
31, 310: heater
31-1, 310-1: center heater
31-2, 310-2: middle heater
31-3: edge heater
32: dielectric plate
33: rubber sheet

The invention claimed is:

1. A plasma processing apparatus comprising:
a processing container which defines a processing space;
a microwave generator; a dielectric having an opposing surface which faces the processing space;
a slot plate formed with a plurality of slots and provided on a surface of the dielectric at an opposite side to the opposing surface to radiate microwaves for plasma excitation to the processing space through the dielectric based on the microwaves generated by the microwave generator; and
a heating member accommodated within an insulating material provided inside the slot plate,
wherein the slot plate has a disk shape, wherein the plurality of slots includes: (i) a first slot group including a plurality of pairs of elongated holes arranged along a circumferential direction of the slot plate, two elongated holes in each pair of elongated holes in the first slot group extending in crossing directions, and (ii) a second slot group including a plurality of pairs of elongated holes arranged along the circumferential direction of the slot plate outside of the first slot group in a radial direction of the slot plate, two elongated holes in each pair of elongated holes in the second slot group extending in crossing directions, and
the heating member includes: (i) a first heater provided in a central region of the slot plate inside the first slot group in the radial direction, (ii) a second heater provided in an intermediate region of the slot plate outside the first slot group in the radial direction, and inside the second slot group in the radial direction, and (iii) a third heater provided in an outer periphery region of the slot plate outside the second slot group in the radial direction.

2. The plasma processing apparatus of claim 1, wherein the first heater is spirally wound in the central region of the slot plate inside the first slot group in the radial direction; the second heater is spirally wound in the intermediate region of the slot plate outside the first slot group in the radial direction, and inside the second slot group in the radial direction; and the third heater is spirally wound in the outer periphery region of the slot plate outside the second slot group in the radial direction.

3. The plasma processing apparatus of claim 1, wherein a heat removal member is provided on a side wall of the processing container.

4. The plasma processing apparatus of claim 3, wherein the heat removal member is beryllium copper or tungsten.

5. The plasma processing apparatus of claim 1, further comprising a waveguide configured to guide the microwaves generated by the microwave generator to the slot plate,
wherein a heat removal member is provided on the waveguide.

* * * * *